United States Patent

[11] 3,634,737

[72] Inventors Hajime Maeda;
Yoshiyuki Takeishi, both of Tokyo; Tai Sato, Yokohama; Hisashi Hara, Kamakura; Yoshihiko Okamoto, Yokohama, all of Japan

[21] Appl. No. 7,979
[22] Filed Feb. 2, 1970
[45] Patented Jan. 11, 1972

[73] Assignee Tokyo Shibaura Electric Co., Ltd. Kawasaki-shi, Japan

[32] Priorities Feb. 7, 1969
[33] Japan
[31] 44/8700;
Feb. 7, 1969, Japan, No. 44/8701

[54] SEMICONDUCTOR DEVICE
7 Claims, 6 Drawing Figs.

[52] U.S. Cl. .......... 317/234,
[51] Int. Cl. .......... H01l 3/00
[50] Field of Search .......... 317/234, 235 AS

[56] References Cited

UNITED STATES PATENTS

| | | | |
|---|---|---|---|
| 2,858,730 | 11/1958 | Hanson | 88/14 |
| 3,458,832 | 7/1969 | McGroddy et al. | 331/107 |
| 3,476,592 | 11/1969 | Berkenlelit et al. | 117/201 |
| 3,476,991 | 11/1969 | Mize et al. | 317/235 |

*Primary Examiner*—James D. Kallam
*Attorney*—Flynn & Frishauf

ABSTRACT: A semiconductor device comprises a substrate made of a semiconductor of diamond-type structure or a compound semiconductor of zincblende-type structure, and an active area formed in the substrate in which electron current flows and to which an intense electric field is applied. aid active area has a specific crystal face which is in a [011] zone or a [100] zone. Said current flows in the prescribed direction decided by the crystal axis in accordance with said crystal face so as to increase the mobility in said area.

SEMICONDUCTOR DEVICE

This invention relates to a semiconductor device, such as an insulated-gate field effect transistor (an MIS-FET); a PN-junction field effect transistor (J-FET) or other semiconductor device having an active area on or in the wafer surface, or on the interface contacting an oxide film.

Studies have been made on the lattice plane or crystal face of a semiconductor wafer to be used in a semiconductor device, and crystal faces such as (111), (110), (112), (113) and (001) face are known to be useful. A particular lattice plane is selected as the top main face of the wafer according to various factors such as surface conditions, density, noise and design of the semiconductor device. However, it has not all been known how the direction in which a current flows in the wafer influences the semiconductor device.

Consequently, it is the object of the present invention to provide a semiconductor device in which current flows in the direction of high carrier mobility by selecting an active area to a suitable lattice plane or crystal face and restricting the direction of current flow to a proper crystal axis, thus improving its characteristics.

In greater details, the present invention provides a semiconductor device including a semiconductor substrate made of a semiconductor of diamond-type structure or a compound semiconductor of zincblende structure-type, said substrate having an active area of a specific crystal face, wherein upon said specific crystal face being in a substantially $[01\bar{1}]$ plane with an angle $\theta$ being defined by the normal direction of said specific crystal face and a [011] axis ranging between 0° to 35°15′*A*, the direction of flow of the electron current is perpendicular to said [011] axis, and with said anole $\theta$ ranging from 35°16′ to less than 90°, the direction of flow of the electron current is parallel to the $[01\bar{1}]$ axis, and upon said specific crystal face being substantially in a [100] plane with an angle $\theta$ defined by the normal direction of the crystal face between 0° to less than 45°, the direction of flow of the electron current is parallel to a [100] axis.

When used in the present invention, the term "[] zone" should be crystallographically construed in a broad sense and covers not only a special [] zone but also other zones equivalent thereto. Similarly, the term "[] axis" covers not only a special [] axis but also other axes equivalent thereto. Furthermore, the axis and zones may be respectively allowed to have ±5° errors thereof.

This invention can be more fully understood from the following detailed description when taken in connection with the accompanying drawings, in which.

Figure 1:
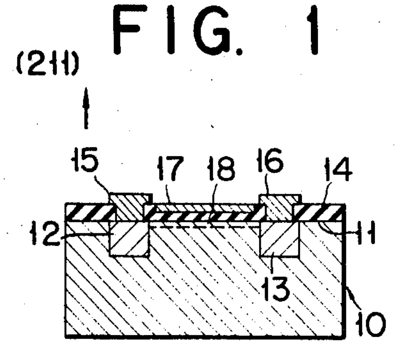
FIG. 1 is a sectional view illustrating a semiconductor device embodying the present invention.
Figure 2A:
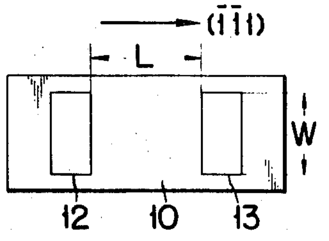
FIGS. 2A and 2B are schematic plan views of the device shown in FIG. 1, wherein the former is not according to the invention.
Figure 2B:
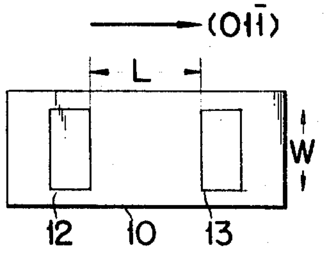

Referring to FIGS. 1, 2A and 2B, there will now be described one embodiment according to the present invention.

There are first prepared N-type silicon wafers 10 each having a specific resistance of 5 to 25 ohm-cm., whose top surfaces 11 are respectively so chosen as to assume lattice planes or crystal planes of (013), (023), (011), (233), (111), (322), (211), (311), (411), (811) and (100) faces. In the top face of said wafer there are provided source and drain regions 12 and 13 spaced apart from each other and the top of said substrate 10 is covered with a silicon dioxide film 14 except on the faces of said regions. Source and drain electrodes 15 and 16, and a gate electrode 17 are attached to said source and drain regions and to a part of said insulating film 14 between said two regions 12 and 13. Thus is constructed MOS-type field effect transistors as shown in FIG. 1. The transistor of this type has an active area 18 of P-channel formed on the top surface of said wafer under the gate electrode.

An example of fabricating such a transistor will be described with reference to FIG. 1.

The substrate 10 of an N-type silicon wafer is subjected to a wet oxygen gas at temperatures of 960° to 1,000° C. to form thereon the film 14 of silicon dioxide having a thickness of 5,000 to 6,000 A., said oxygen gas having been passed through 80° C. water. Parts of the $SiO_2$ film 14 thus formed are removed by photoetching to allow the surface of wafer 10 to be exposed in the form of two stripes. On the exposed surfaces of the wafer, viz portions from which the $SiO_2$ film has been removed, is deposited $BBr_3$ which is then diffused in the film by being heat-treated at 1,050° C. to form the P-type source region 12 and P-type drain region 13. Thereafter, the remaining $SiO_2$ film left on the surface of the wafer 10 is removed by an HF aqueous solution treatment. The Si wafer 10 is heat-treated in a wet oxygen atmosphere for 4 minutes at 1,145° C. and then in a dry oxygen atmosphere for 10 to 15 minutes at 1,145° C. so as again to form an $SiO_2$ film on the entire top surface of the wafer. The film thus deposited is doped with phosphorus to eliminate the effect of faults in the film. The $SiO_2$ film deposited on the source region 12 and drain region 13 is removed. Subsequently, an aluminum layer is evaporated on the entire $SiO_2$ film and the source and drain regions. The aluminum layer is then removed except for on the source and drain regions and on the part between both regions, thereby forming the source, drain and gate electrodes 15, 16 and 17 on the source and drain regions and on the portion of $SiO_2$ between source and drain regions respectively. The wafer surface right below the gate electrode 17 forms a channel or active region, having a width W of, say, 100$\mu$ and a length L of, say, 200$\mu$. The source and drain regions 12 and 13 are so arranged as to enable an electric current to flow in a predetermined direction in the active region after the direction of the crystal axis on the wafer crystal face has been determined by X-rays. When, a crystal face belongs, for example, to a $[01\bar{1}]$ zone (i.e., lies in a [01T] plane), a (211) face is used as said top surface of the wafer 10. The surface normal direction is, as shown in FIG. 2A, taken in the direction of a [211] crystal axis, and the main face is disposed parallel to the intrinsic crystal face (211) within a ±5° tolerance. The source and drain regions 12 and 13 are arranged such that the direction of flow of electron current passing therebetween is either that of the $[\bar{1}11]$ (or $[1\bar{1}\bar{1}]$) crystal axis (FIG. 2A) or that of $[01\bar{1}]$ (or $[0\bar{1}1]$) crystal axis (FIG. 2B) whereby the direction of current*f* flow can be specified within a ±5° tolerance.

Alternatively, when a crystal face belongs, for example, to [100] zone, a (023) face is used as said top surface of the wafer 10. The direction of flow of electron current is chosen to be that of the $[\bar{1}00]$ crystal axis or $[0\bar{3}2]$ axis.

A voltage $V_{DS}$=10mV is impressed at both temperatures, 293° K. (normal temperature) and 77° K. between source and drain regions, and another voltage $V_G$ between the gate and source regions with the source electrode and substrate short circuited, the mutual conductance *gm* was measured and the field effect mobility $\mu_{FE}$ is obtained from the relationship:

$$gm=W/L\cdot\epsilon ox/d\cdot\mu_{FE}\cdot V_{DS}$$

where:

$\epsilon ox$ = the permittivity of the oxide film,
$d$ = the thickness of the oxide film,
$L$ = the length of the channel, and
$W$ = the width of the channel.

Transistors having a (211) and (023) face as well as other crystal faces as a main plane are manufactured by the same method as described above, and measured their mobility $\mu_{FE}$. As a result, it has been found that the mobility $\mu_{FE}$ of the transistors which have a main plane other than the (111) and (100) faces is affected by the direction in which current flows through the transistor.

Figure 3:
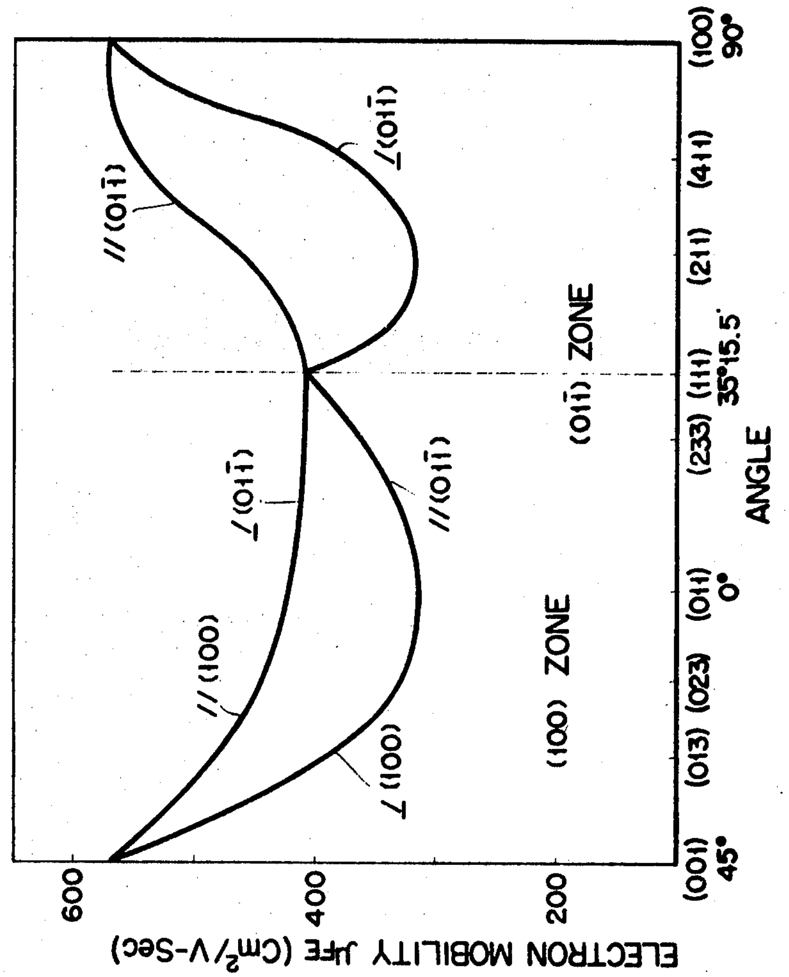
FIG. 3 is a graph showing the calculated values of electron mobility.

FIG. 3 shows the result of the maximum and minimum values of the mobility $\mu_{FE}$ in the case of $V_G-V_T=25V$ and at a normal temperature.

Generally, the larger the $V_G-V_T$, the smaller the mobility. But the relative relationship between the curves shown in FIG. 3 is little affected. In the figure, $V_G$ designates the gate voltage, $V_T$ the threshold voltage of electron current at the initial flow, and $//\langle 01\bar{1}\rangle$ and $\perp\langle 01\bar{1}\rangle$ respectively the directions of current which are parallel and normal to the $\langle 01\bar{1}\rangle$ crystal axis, and $//\langle 100\rangle$ and $\perp\langle 100\rangle$ respectively the directions of current which are parallel and normal to the [100] crystal axis.

As seen from FIG. 3, in the case of $\langle 01\bar{1}\rangle$ zone, the mobility $\mu_{FE}$ running in the $\perp\langle 01\bar{1}\rangle$ is larger than that in the $//\langle 01\bar{1}\rangle$ between the (011) and (111) faces, while the mobility $\mu_{FE}$ along the $//\langle 01\bar{1}\rangle$ is larger than that along the $\perp\langle 01\bar{1}\rangle$ between the (111) and (100) faces.

In the case of $\langle 100\rangle$ zone, the mobility $\mu_{FE}$ in the $//\langle 100\rangle$ is larger than that in the $\perp\langle 100\rangle$ between the (001) and (011) faces, (001) face exclusive.

It has also been found that the results obtained at normal temperature can equally apply to those measured at 77° K. Although there is an error of ±5° between the designations of the wafer surface orientation and the direction of current flow, the same results have been obtained even when the angle is purposely shifted with a ±5° tolerance.

Consequently, the flow of a highly mobile carrier current can be best utilized by selecting the direction of current flow of a metal oxide silicon field effect transistor with respect to its specified wafer orientation to be normal to the $\langle 01\bar{1}\rangle$ crystal axis in the case when the crystal surface is selected between (011) and (111) faces ((111) face exclusive) when the main surface of the wafer belongs to $\langle 01\bar{1}\rangle$ zone and is parallel to the $\langle 01\bar{1}\rangle$ crystal axis between (111) and (100) faces ((111) and (100) faces exclusive).

According to this invention, similar results can be obtained not only when semiconductors of diamond-type structure, for example, germanium, semiconducting diamond, boron nitride, are used but when compound semiconductors of zincblende-type structure, for example, gallium arsenide, gallium phosphide, antimonide, are used, insofar as the intensity E of an electric field in the semiconductor interface is larger than $1\times10^3$ v./cm. For example, similar results have been obtained by the use of germanium and gallium arsenide under the conditions $E>6\times10^3$ v./cm. and $E>5\times10^3$ v./cm., respectively.

Figure 4A:
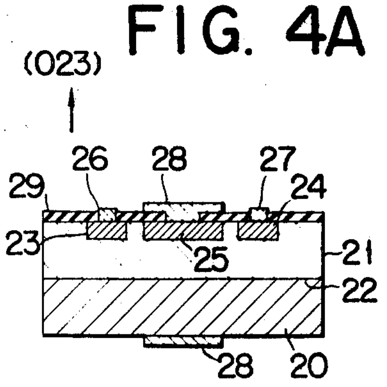
FIGS. 4A and 4B are respectively sectional and plan views of a semiconductor device according to another embodiment.
Figure 4B:
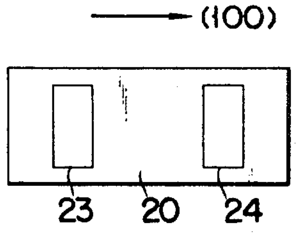

In the above embodiment, the rectangular gate has been taken as an example. It should be understood that the same results can be obtained by the use of a comb-shaped gate with respect to the direction of the main electron current. Since the above phenomena are common to the electron mobility in an intense electric field, similar effects can be produced not only in metal oxide silicon field effect transistors but also in PN-junction field effect transistors as described below with reference to FIGS. 4A and 4B.

The numeral 20 denotes an $N^+$-type silicon substrate whose top main surface consists of (023) face on which an epitaxial P-type layer 21 is deposited to form a PN-junction 22 between the substrate and layer 21. On the upper side of the layer 21 are formed diffused or alloyed $P^+$-type source and drain regions 23 and 24 and a diffused $N^+$-type gate region 25 which are spaced from one another. Of course these source and drain regions 23 and 24 could be omitted as occasion demands. To the upper surface of said regions 23 and 24 respectively attached source and drain electrodes 26 and 27, and on the opposite surfaces of the substrate and P-type layer two gate electrodes 28. On the upper part of the P-type layer except on the electrodes there is provided an insulating film 29 such as a silicon dioxide film. In this transistor, the direction of current which flows between source and drain regions is selected to accord with the (100) or ($\bar{1}$00) crystal axis.

We claim:

1. A semiconductor device comprising a substrate of a semiconductor selected from the group consisting of a semiconductor of diamond-type structure and a compound semiconductor of zincblende-type structure, said substrate comprising an active area formed therein in which electron current flows and means for applying an intense electric field to said active area, said active area having a crystal face, and upon said crystal face being substantially in a [01$\bar{1}$] plane at an angle with a [01$\bar{1}$] axis ranging between 0° to 35°15′ the direction of flow of the electron current is perpendicular to the [01$\bar{1}$] axis, and upon said crystal face being substantially in [01$\bar{1}$] plane at an angle with a [011] axis ranging from 35°16′ to less than 90° the direction of flow of said electron current is parallel to the [01$\bar{1}$] axis, and upon said crystal face being substantially in a [100] plane at an angle with a [011] axis ranging from 0° to less than 45°, the direction of flow of said electron current is parallel to the [100] axis.

2. A semiconductor device according to claim 1 wherein said substrate includes source and drain regions spacedly formed in the top surface thereof, each of which has a conductivity opposite to that of the substrate, an insulating film formed on the surface of said substrate between said source and drain regions, a gate electrode formed on said insulating film, and said active area is a channel formed between the source and drain regions.

3. A semiconductor device according to claim 1 wherein said substrate includes at least one PN-junction of which major part is formed in parallel to the top surface thereof, and spaced source and drain regions formed in said substrate, said active area being defined between said regions.

4. A semiconductor device according to claim 1, in which the intensity of the high electric field formed within the active area is more than $1\times10^3$ v./cm.

5. A semiconductor device comprising a substrate of a semiconductor selected from the group consisting of a semiconductor of diamond-type structure and a compound semiconductor of zincblende-type structure, said substrate comprising an active area formed therein in which electron current flows and means for applying an intense electric field to said active area, said active area having a crystal face, and upon said crystal face being substantially in a [01$\bar{1}$] plane at an angle with a [011] axis ranging between 0° to 35°15′, the direction of flow of the electron current is perpendicular to a [01$\bar{1}$] axis.

6. A semiconductor device comprising a substrate of a semiconductor selected from the group consisting of a semiconductor of diamond-type structure and a compound semiconductor of zincblende-type structure, said substrate comprising an active area formed therein in which an electron current flows and means for applying an intense electric field to said area, said active area having a crystal face, and upon said crystal face being substantially in a [01$\bar{1}$] plane at an angle with a [011] axis ranging from 35°16′ to less than 90°, the direction of flow of the electron current is in parallel to a [01$\bar{1}$] axis.

7. A semiconductor device comprising a substrate of a semiconductor selected from the group consisting of a semiconductor of diamond-type structure and a compound semiconductor of zincblende-tpe structure, said substrate comprising an active area formed therein in which an electron current flows and means for applying an intense electric field to said active area, said active area having a crystal face, and upon said crystal face being substantially in a [100] plane at an angle with a [011] axis ranging between 0° to less than 45°, the direction of flow of the electron current is in parallel to a [100] axis.

* * * * *